（12） United States Patent
Vaddiparty et al.

(10) Patent No.: US 10,320,064 B2
(45) Date of Patent: Jun. 11, 2019

(54) MULTIPORT AMPLIFIERS (MPAS) USING OUTPUT FILTERING TO IMPROVE PERFORMANCE OVER LIFE

(71) Applicant: Space Systems/Loral, LLC, Palo Alto, CA (US)

(72) Inventors: Subrahmanyam V. Vaddiparty, San Jose, CA (US); Zheng Tu, Santa Clara, CA (US); Vijaya Korwar Gallagher, San Jose, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 249 days.

(21) Appl. No.: 15/364,115

(22) Filed: Nov. 29, 2016

(65) Prior Publication Data

US 2017/0229765 A1 Aug. 10, 2017

Related U.S. Application Data

(60) Provisional application No. 62/291,397, filed on Feb. 4, 2016.

(51) Int. Cl.
*H01Q 21/24* (2006.01)
*H01Q 1/28* (2006.01)
*H03F 3/21* (2006.01)
*H04B 1/04* (2006.01)

(52) U.S. Cl.
CPC .......... *H01Q 1/288* (2013.01); *H01Q 21/24* (2013.01); *H03F 3/211* (2013.01); *H03F 2200/294* (2013.01); *H03F 2203/21157* (2013.01); *H04B 2001/0408* (2013.01)

(58) Field of Classification Search
CPC ........ H01Q 1/288; H01Q 21/24; H03F 3/211; H03F 2200/294; H03F 2203/21157; H04B 2001/0408
See application file for complete search history.

(56) References Cited

U.S. PATENT DOCUMENTS

| 8,103,225 B2 | 1/2012 | Couchman et al. |
| 8,248,977 B2 * | 8/2012 | Harverson ......... H04B 7/18515 370/310.2 |
| 8,463,204 B2 | 6/2013 | Jones et al. |

(Continued)

FOREIGN PATENT DOCUMENTS

EP 2 073 381 A1 6/2009

OTHER PUBLICATIONS

Tomonori, K. et al., 3-5 Ka-band High Power Multi-port Amplifier (MPA), NiCT, Journal of the National Institute of Information and Communications Technology, vol. 54, No. 4, 2007, 45-52.

(Continued)

*Primary Examiner* — Graham P Smith
(74) *Attorney, Agent, or Firm* — Weaver Austin Villeneuve & Sampson LLP

(57) ABSTRACT

A payload subsystem of a satellite includes a plurality of transmit antenna feeds, a plurality of frequency filters, and a power amplification arrangement including a plurality of power amplifiers. The power amplification arrangement has at least one multiport amplifier, the multiport amplifier including a plurality of output ports, each output port coupled with a respective one of the plurality of transmit antenna feeds by way of a respective one of the plurality of frequency filters.

20 Claims, 11 Drawing Sheets

(56) References Cited

U.S. PATENT DOCUMENTS

| | | |
|---|---|---|
| 8,588,343 B2 | 11/2013 | Moon et al. |
| 8,737,528 B2 | 5/2014 | Shin et al. |
| 2010/0226307 A1 | 9/2010 | Harverson |
| 2014/0320346 A1 | 10/2014 | Caille et al. |
| 2014/0354355 A1 | 12/2014 | Moreau et al. |

OTHER PUBLICATIONS

Moon S., et al., "Adaptive Calibration Method in Multiport Amplifier for K-Band Payload Applications," ETRI Journal, vol. 35, No. 4, Aug. 2013, 718-721/.

* cited by examiner

| Center Frequency (MHz) | 11768 | 11876 | 11984 | 12092 |
|---|---|---|---|---|
| H-polarization | 1 | 3 | 5 | 7 |
| V-Polarization |  | 2 | 4 | 6 |

| Center Frequency (MHz) | 11768 | 11876 | 11984 | 12092 |
|---|---|---|---|---|
| RHC-polarization | 1 | 3 | 5 | 7 |
| LHC-Polarization | | 2 | 4 | 6 |

| Center Frequency (MHz) | 11768 | 11822 | 11876 | 11930 | 11984 | 12038 | 12092 |
|---|---|---|---|---|---|---|---|
| H-polarization | 1 | 3 | 5 | 7 | 9 | 11 | 13 |
| V-Polarization | 2 | 4 | 6 | 8 | 10 | 12 | 14 |

| Center Frequency (MHz) | 11768 | 11822 | 11876 | 11930 | 11984 | 12038 | 12092 |
|---|---|---|---|---|---|---|---|
| LHC-polarization | 1 | 3 | 5 | 7 | 9 | 11 | 13 |
| RHC-Polarization | 2 | 4 | 6 | 8 | 10 | 12 | 14 |

| Center Frequency (MHz) | 11768 | 11822 | 11876 | 11930 | 11984 | 12038 | 12092 | 12146 |
|---|---|---|---|---|---|---|---|---|
| H-polarization | 1 | 3 | 5 | 7 | 9 | 11 | 13 | 15 |
| V-Polarization | 2 | 4 | 6 | 8 | 10 | 12 | 14 | 16 |

MULTIPORT AMPLIFIERS (MPAS) USING OUTPUT FILTERING TO IMPROVE PERFORMANCE OVER LIFE

CROSS-REFERENCE TO RELATED APPLICATIONS

This disclosure claims priority to U.S. Provisional Patent Application No. 62/291,397, filed Feb. 4, 2016, entitled "Multi-Port Amplifiers (MPAs) Using Output Filtering to Improve Performance Over Life," and assigned to the assignee hereof, the disclosure of which is hereby incorporated by reference in its entirety into this Patent Application for all purposes.

TECHNICAL FIELD

This invention relates generally to a satellite communication payload, and more particularly to a satellite payload using multi-port amplifiers (MPAs).

BACKGROUND

The assignee of the present invention manufactures and deploys spacecraft for, inter alia, communications and broadcast services. Market demands for such spacecraft have imposed increasingly stringent requirements for payload flexibility and utilization efficiency. For example, there is an increased need for multi-port Amplifiers (MPAs) to provide more flexibility to move power from one beam to another, depending on the traffic demand.

An MPA is a circuit arrangement where an array of high power amplifiers, a N port input network, and a N port output network are configured such that the total output power provided by the array of amplifiers can be reapportioned at the N output ports of the output network, in relation to the signals at the N input ports of the input network. MPAs may be attractive for satellite payloads that utilize multiple beam antenna configurations. For example, MPAs may allow efficient and flexible sharing of total power from each power amplifier to be shared amongst the multiple beams, and permit adapting to the needs of variable traffic conditions or link conditions.

In the absence of an MPA scheme, one high power amplifier is associated with a respective antenna beam. In the absence of redundancy schemes, the failure of one high power amplifier may lead to the loss of the respective antenna beam. Furthermore, there is no way to redirect RF power from one high power amplifier to another antenna beam.

In contrast, in an MPA, the RF power at one of the beams in a multibeam configuration is a fraction of the total available RF power from the collection of HPAs. Failure of one high power amplifier reduces total RF output power, but does not cause total loss of a beam. Moreover, adjustment of the input signals permits increased flexibility in apportioning total available RF power amongst the multiple antenna beams.

An elemental implementation of an MPA includes two high power amplifiers sandwiched between two quadrature hybrid couplers, resulting in a configuration with two input ports and two output ports. When scattering parameters of the two amplifiers are identical, for a voltage applied at one of the input ports, all reflected voltages will sum to the termination at the second input port (referred to as the isolated input port). Moreover, the output power at one of the output ports will be twice that of a single amplifier, with no power lost at the second output port (referred to as the isolated output port).

When non-coherent inputs are present at each of the two input ports, based on the superposition principle, the signal on a particular input port will be output at its respective output port, and will not be output on the associated isolated output port.

By adjusting the amplitude ratio between the voltage inputs at the first and second input ports, the apportioning of total RF output power amongst the two output ports can be divided continuously between the opposite extreme ends.

A general topology of an MPA may include an array of high power amplifiers, an input multiport network, and an output multiport network. In certain embodiments, the input and output network can be in the form of Butler matrices. When the number of beams is less than an integer power of 2, the unused input/output ports can be terminated by matched loads.

For a theoretically ideal MPA implementation, a signal at one input port, after being split in the N port input network and amplified by the N HPAs, will be output at a single output port with no leakage of power to the associated N-1 isolated output ports. A real MPA, due to amplitude/phase imbalances in the input/output network, and gain/phase nonuniformity in the HPA array, will deviate from the ideal case. In other words, a signal at one input port will be output at more than one output port.

Thus, MPA performance is susceptible to degradation due to changes in gain and phase of the MPA components, which may vary significantly over the life of the satellite. In particular, components of a travelling wave tube amplifier (TWTA) or a solid-state power amplifier (SSPA) included in the MPA may exhibit gain and phase variation, particularly for high-frequency applications using the Ku, Ka and higher frequency bands. At Ku band, for example, relative phase variations between the set of TWTAs used in an MPA can be as large as 20 degrees over a 15 year satellite life, and gain variations can be of the order of 1 dB over 15 years.

In the absence of the presently disclosed techniques, calibration of these gain and phase variations over life and compensation for the variations are essential to the proper functioning of the MPAs. Otherwise, in many applications, these variations result in leakage of desired channel power into adjacent channels, which can manifest as coherent interference or multipath effects, as well as a reduction in power at the desired output ports. Many schemes for onboard and ground-based compensation have been proposed, including, for example, U.S. Pat. Nos. and 8,103,225, 8,463,204, 8,588,343, 8,737,528. These known techniques require the addition of amplitude and phase sensing components on the spacecraft, together with a means of adjusting amplitude and phase in the MPA, whether or not a ground station is involved in calculating the necessary adjustments. All of this leads to additional cost and complexity.

Thus, there is a desire to find techniques that permit usage of MPAs while avoiding the above-mentioned calibration and compensation schemes.

SUMMARY

The presently disclosed techniques relate the use of multi-port amplifiers (MPAs). In some implementations, the MPAs are included in a satellite payload subsystem, operable, advantageously, at a frequency band of Ku band or higher.

According to some implementations, a payload subsystem of a satellite includes a plurality of transmit antenna feeds, a plurality of frequency filters, and a power amplification arrangement including a plurality of power amplifiers, the power amplification arrangement having at least one multiport amplifier, the multiport amplifier including a plurality of output ports, each output port coupled with a respective one of the plurality of transmit antenna feeds by way of a respective one of the plurality of frequency filters.

In some examples, the payload subsystem may be configured to operate at a frequency band of Ku band or higher.

In some examples, the power amplification arrangement may be configured to exhibit a ratio of carrier-to-isolation (C/I), between adjacent ones of the plurality of transmit antenna feeds, of at least 30 dB. In some examples, the power amplification arrangement may exhibit a C/I, between adjacent ones of the plurality of transmit antenna feeds, of at least 30 dB irrespective of whether calibration of gain and phase variations over life and compensation for the gain and phase variations is performed. In some examples, calibration of the gain and phase variations over life and compensation for the gain and phase variations may be avoided. In some examples, the transmit antenna feeds may correspond to a coverage map comprising a plurality of coverage regions, wherein adjacent coverage regions are diverse in one or both of channel center frequency and antenna polarization. In some examples, the antenna polarization may be diverse in one or both of linear polarization type and circular polarization type.

In some examples, the payload subsystem may further include a digital channelizer configured to process a plurality of input signals and to create reconfigurable channels to route the plurality of input signals to a plurality of digital channelizer output ports. The plurality of digital channelizer output ports may be communicatively coupled to the at least one multiport amplifier. In some examples, the at least one multiport amplifier may include a plurality of identical or nearly identical fixed power high power amplifiers (HPAs) whose inputs are communicatively coupled to the plurality of digital channelizer output ports. In some examples, the at least one multiport amplifier may include a plurality of identical or nearly identical variable power high power amplifiers (HPAs) whose inputs are communicatively coupled to the plurality of digital channelizer output ports, wherein output power levels of the variable power HPAs are set and varied approximately in unison.

In some examples, at least one of the frequency filters may have a rolloff characteristic such that there is 15 dB attenuation between adjacent ones of the plurality of transmit antenna feeds.

In some examples, the frequency filters may include surface acoustic wave filters.

In some examples, the frequency filters may be implemented as a band pass filter, a low-pass filter, a high-pass filter, or a serial combination of low-pass and high-pass filters.

In some examples, the frequency filters may have a passband at least as wide as a channel bandwidth allocated for one of the transmit antenna feeds.

In some examples, the power amplifiers are implemented as either SSPAs or TWTAs.

According to some implementations a satellite includes a payload subsystem including a plurality of transmit antenna feeds, a plurality of frequency filters, and a power amplification arrangement including a plurality of power amplifiers, the power amplification arrangement having at least one multiport amplifier, the multiport amplifier including a plurality of output ports, each output port coupled with a respective one of the plurality of transmit antenna feeds by way of a respective one of the plurality of frequency filters and he payload subsystem is configured to operate at a frequency band of Ku band or higher.

In some examples, the power amplification arrangement may be configured to exhibit a ratio of carrier-to-isolation (C/I), between adjacent ones of the plurality of transmit antenna feeds, of at least 30 dB. In some examples, the power amplification arrangement may exhibit a C/I, between adjacent ones of the plurality of transmit antenna feeds, of at least 30 dB irrespective of whether calibration of gain and phase variations over life and compensation for the gain and phase variations is performed. In some examples, calibration of gain and phase variations over life and compensation for the gain and phase variations may be avoided. In some examples, the transmit antenna feeds may correspond to a coverage map comprising a plurality of coverage regions, wherein adjacent coverage regions are diverse in one or both of channel center frequency and antenna polarization.

DETAILED DESCRIPTION OF DRAWINGS

Features of the invention are more fully disclosed in the following detailed description of the preferred embodiments, reference being had to the accompanying drawings, in which like reference numerals designate like structural element, and in which.

Figure 1:
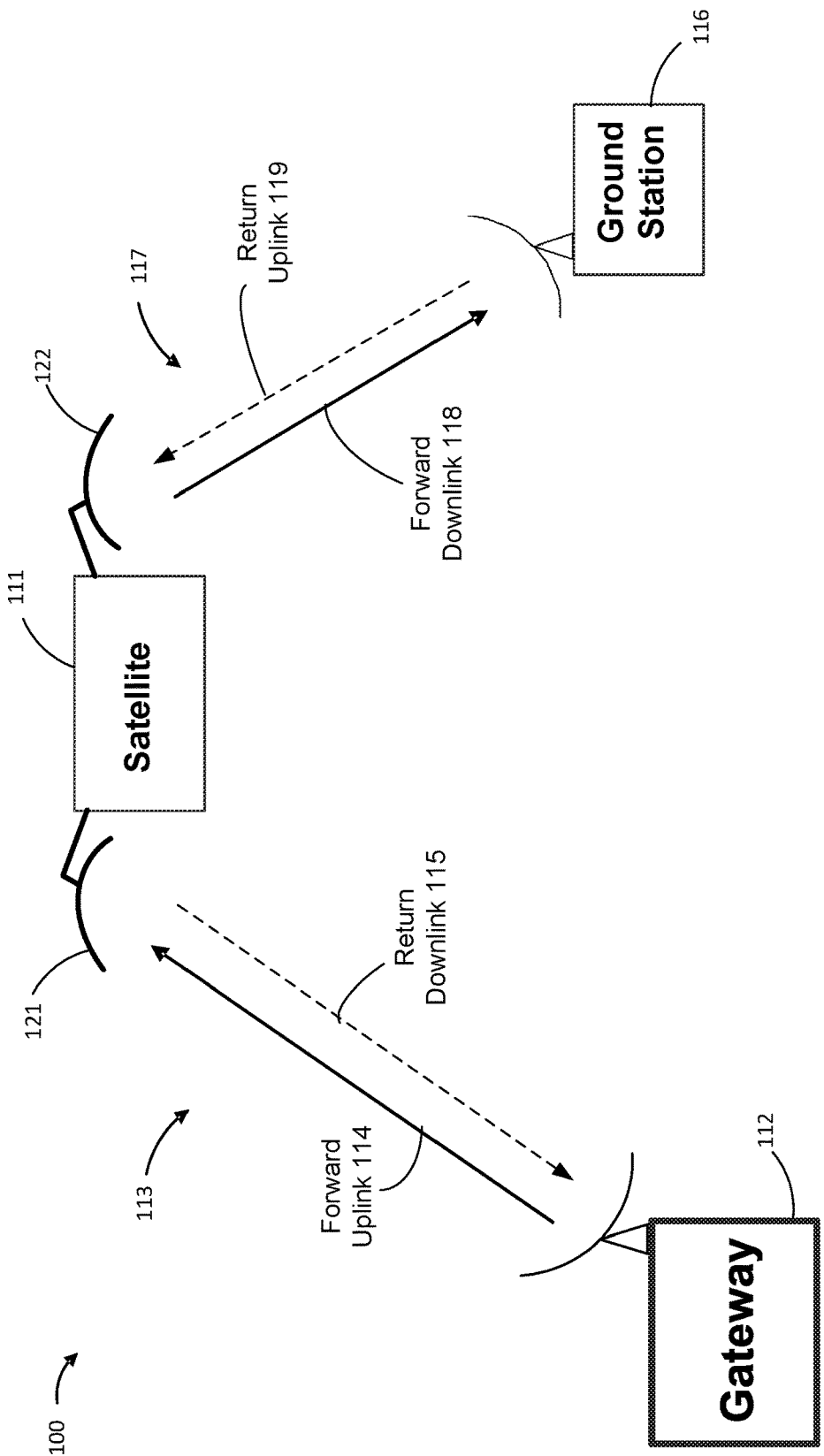
FIG. 1 illustrates a simplified diagram of a conventional satellite communications network.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when a feature is referred to as being "connected" or "coupled" to another feature, it can be directly connected or coupled to the other feature, or intervening e feature s may be present. Furthermore, "connected" or "coupled" as used herein may include wirelessly connected or coupled. It will be understood that although the terms "first" and "second" are used herein to describe various features, these features should not be limited by these terms. These terms are used only to distinguish one feature from another feature. Thus, for example, a first user terminal could be termed a second user terminal, and similarly, a second user terminal may be termed a first user terminal without departing from the teachings of the present invention. As used herein, the term "and/or" includes any and all combinations of one or more of the associated listed items. The symbol "/" is also used as a shorthand notation for "and/or".

The terms "spacecraft", "satellite" and "vehicle" may be used interchangeably herein, and generally refer to any orbiting satellite or spacecraft system.

In FIG. 1, a simplified diagram of a conventional satellite communications network 100 is illustrated. The network includes a satellite 111, which may be located, for example, at a geostationary orbital location, or in a geosynchronous inclined orbit, a low earth orbit or a medium earth orbit. The satellite 111 may be communicatively coupled, via at least one receive antenna 121, by a feeder link 113 to a gateway 112. The satellite 111 may also be communicatively coupled via at least one transmit antenna 122, by a user link 117, to a ground station (or user terminal) 116. Although for clarity of illustration, only a single gateway 112 and a single ground station 116, is depicted in FIG. 1, it will be appreciated that satellite 111 may ordinarily be communicatively coupled simultaneously with a substantial number of gateways 112 and ground stations 116. Each feeder link 113 includes a forward uplink 114 and may include a return downlink 115. Each user link 117 includes a forward downlink 118 and may include a return uplink 119. The feeder link 113 and the user link 117 may operate at one or more microwave bands, including, for example, L-band, S-band, C-band, Ku-band, Ka-band, Q-band and V-band.

Figure 2A:
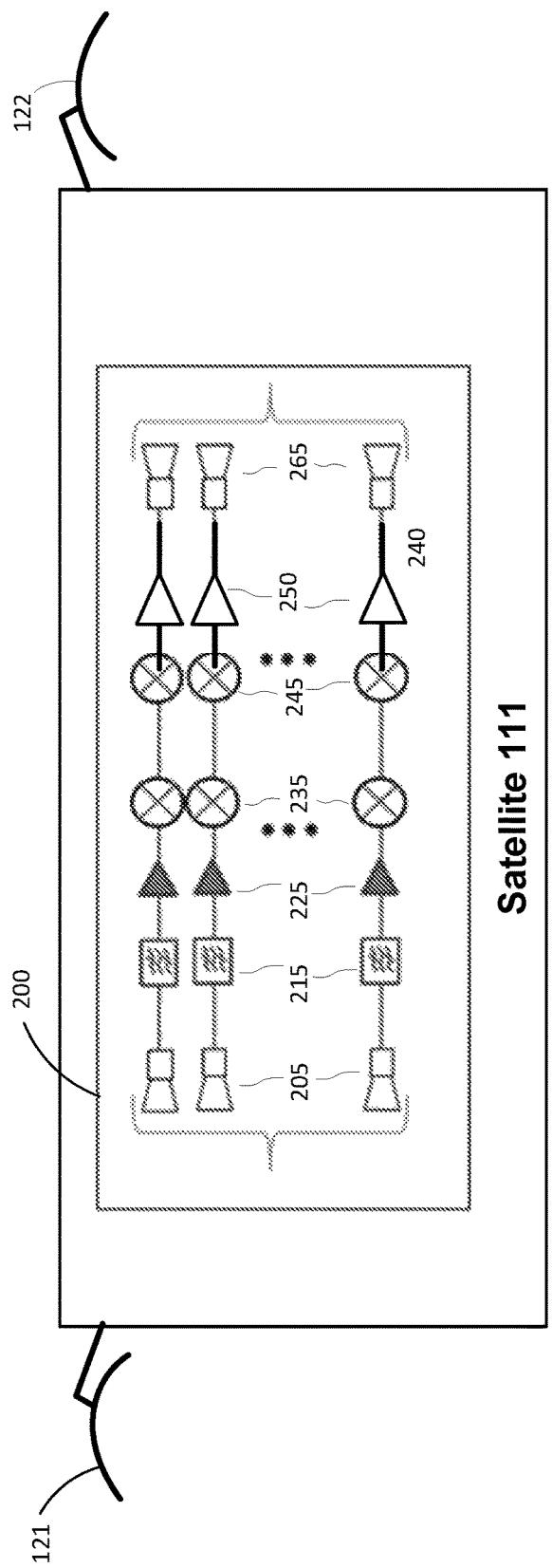
FIG. 2A illustrates a simplified block diagram of a satellite payload subsystem disposed within the satellite.

Satellite 111 will ordinarily include a payload subsystem for, inter alia, processing signals traveling between gateways 112 and ground stations 116. Referring now to FIG. 2A, a simplified block diagram of a satellite payload subsystem 200 disposed within the satellite 111 is illustrated. The payload subsystem 200 may include receive antenna feeds 205 illuminated by feeder link antenna 121, filters 215, low-noise amplifiers (LNAs) 225, frequency converters, including input local oscillators 235, including output local oscillators 245, power amplifiers (PAs) 250, which may or may not include linearization, and transmit antenna feeds 265 that illuminate user link antenna 122. The active or DC power consuming hardware, such as LNAs 225, frequency converters, and PAs 250 may be arranged in redundancy rings (not illustrated) with input and output switches configured to permit continuity of service in the event of a component failure—that is, if particular component fails, switches are thrown to route the signals to a spare unit. One or more of the PAs 250 may be a multiport amplifier (MPAs) and include high power amplifiers (HPAs) including TWTAs and or SSPAs. In some implementations, the payload subsystem 200 may include a digital channelizer (not illustrated). In some implementations, the satellite 111 may include a processor (not illustrated) configured to control the digital channelizer, and to adjust a saturated output power of at least one power amplifier of the plurality of PAs 250 as disclosed in U.S. patent application Ser. No. 14/965,620, entitled "DIGITAL PAYLOAD WITH VARIABLE HIGH POWER AMPLIFIERS", assigned to the assignee of the present application and incorporated herein by reference in its entirety.

Figure 2B:
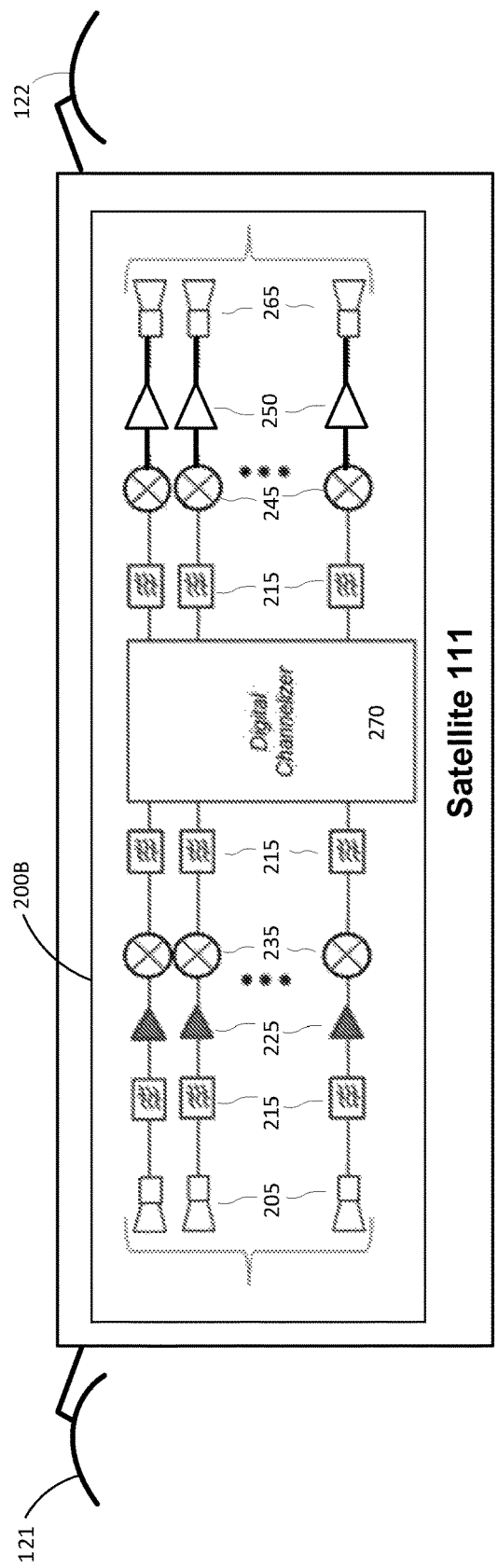
FIG. 2B illustrates a simplified block diagram of a spacecraft payload subsystem including a digital channelizer.

Referring now to FIG. 2B, a simplified block diagram of the satellite payload subsystem 200B with at least one digital channelizer 270 is illustrated. The digital channelizer 270 may receive analog RF input signals by way of a quantity 'N' of receive ports, where 'N' is greater than or equal to 1. The digital channelizer 270 may enable the payload subsystem 200B to process multiple input signals and to reconfigurably distribute portions of those input signals into multiple output signals and to create reconfigurable channels to route the multiple input signals to multiple output ports. The digital channelizer 270 may include analog-to-digital converters, digital-to-analog converters, control computer(s) with software or firmware, and signal processing electronics (not illustrated). The digital channelizer 270 may forward analog RF output signals by way of a quantity 'M' of transmit ports, where 'M' is greater than or equal to 1. It will be appreciated that quantity 'M' is not necessarily equal to quantity 'N'. The multiple inputs and outputs provide redundancy for the payload 120, in addition to redundancy within the channelizer.

The digital channelizer 270 may be capable of operating over all or a substantial part of the frequency ranges that are allocated to the payload subsystem 200B. The digital channelizer 270 may sub-divide the uplink frequency spectrum into smaller segments and permit fine bandwidth adjustability in the smaller segments. The digital channelizer 270 may also tune, in fine or coarse increments, responsive to ground and/or onboard commands, the channel center frequency and bandwidth allocated to a particular uplink beam on a communications satellite, in addition to adjusting the frequency response curve and other characteristics of each channel. The digital channelizer 270 may directly handle uplink frequencies and/or downlink frequencies, thus, in some implementations, replacing some or all of the filters 215, the input frequency converters 235 and output frequency converters 245. Other functions of a digital channelizer may include frequency conversion, demodulation, bit detection, and modulation, among others.

Thus, it is contemplated that a spacecraft payload subsystem may be configured to include a digital channelizer as illustrated in FIG. 2B, or omit a digital channelizer, as illustrated in FIG. 2A. In either configuration, PAs 250 may be configured as multiport amplifiers.

Figure 3:
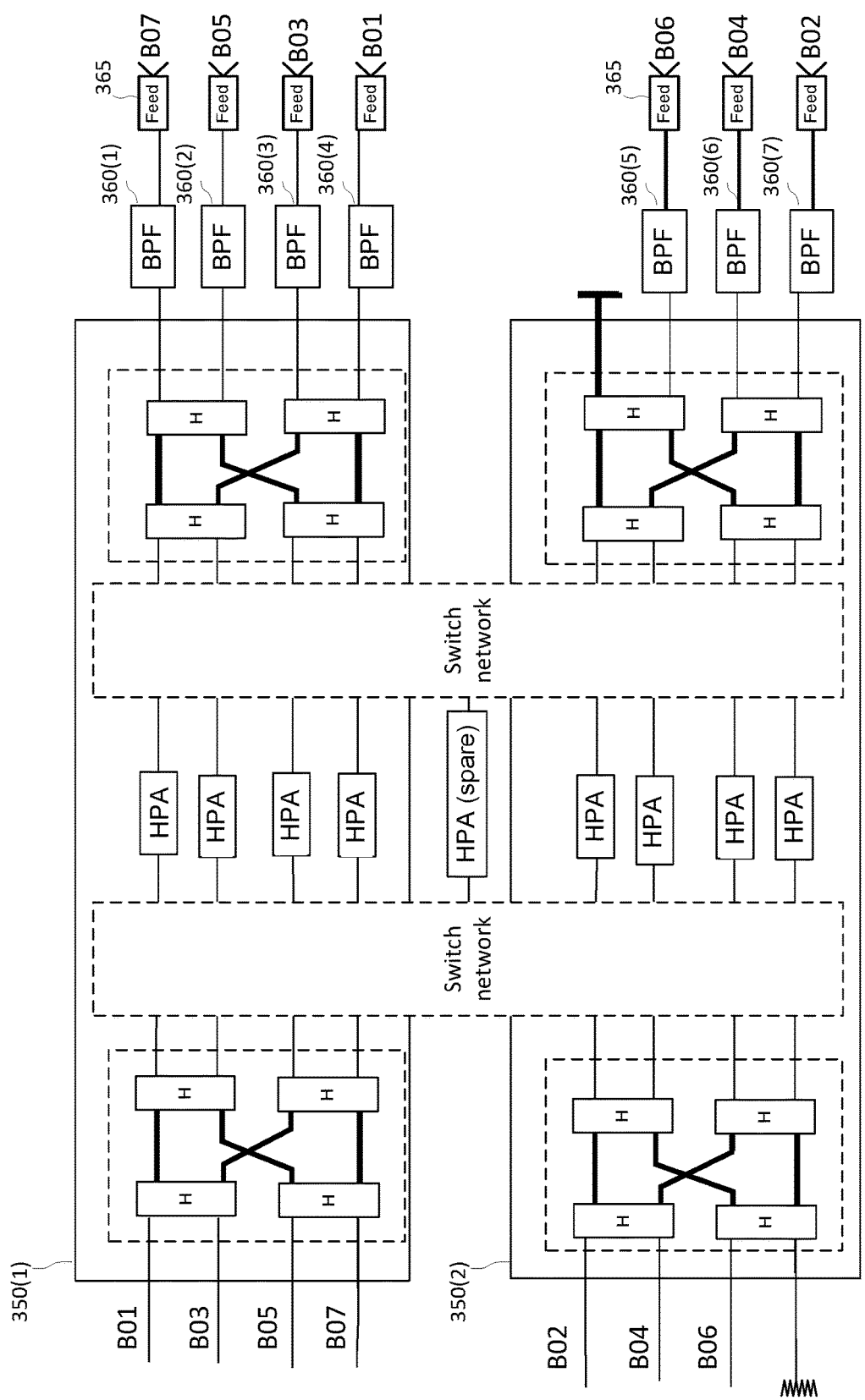
FIG. 3 illustrates an example implementation that includes two 4×4 MPAs serving seven beams.
Figure 4:
FIG. 4 illustrates an example of a coverage map indicating the location, frequency, and polarization of multiple beams.

According to the presently disclosed techniques, judicious use of frequency assignment and the inclusion of output filters to reduce the impact of multipath and adjacent channel interference obviates the need for onboard calibration, even where the operating frequency band is Ku band or higher. Referring to FIG. 3, an example implementation is illustrated that includes two 4×4 MPAs 350(1) and 350(2) serving seven beams, beams B01, B03, B05 and B07 being associated with MPA 350(1) and beams B02, B04 and B05 being associated with MPA 350(2). The beams may each be associated with a geographic coverage region. For example, FIG. 4 illustrates a map of an example implementation indicating the coverage region of each beam, as well as frequency and polarization of each of the seven beams. Four of the beams, (beams 1, 3, 5, and 7, each in the illustrated example having an H polarization) are associated with a first 4×4 MPA 350(1) and the other three beams (beams 2, 4, and 6, each in the illustrated example having a V polarization) are associated with a second 4×4 MPA 350(2). In the illustrated implementation, a respective frequency filter 360 (i) is disposed at the output of each MPA port and may provide about 15 dB rejection at the adjacent channel edge.

In the absence of such filtering, and if no means of compensation of phase and gain over life is included, a practically implementable MPA that has co-frequency (same frequency) and co-polarization (same polarization) signals at each of its ports might lead to a carrier-to-isolation (C/I) ratio of 15 dB. However, when co-frequency signals at the other ports are suppressed by 15 dB due to rolloff provided by frequency filter 360(i), the effective isolation is 15+15=30 dB, which has been found adequate to effectively obviate multipath effects. Similarly, if the different ports on the MPA have the same frequency but are connected to disparately polarized feeds, then the additional polarization isolation of about 30 dB may reduce co-frequency power received at the ground.

Figure 5:
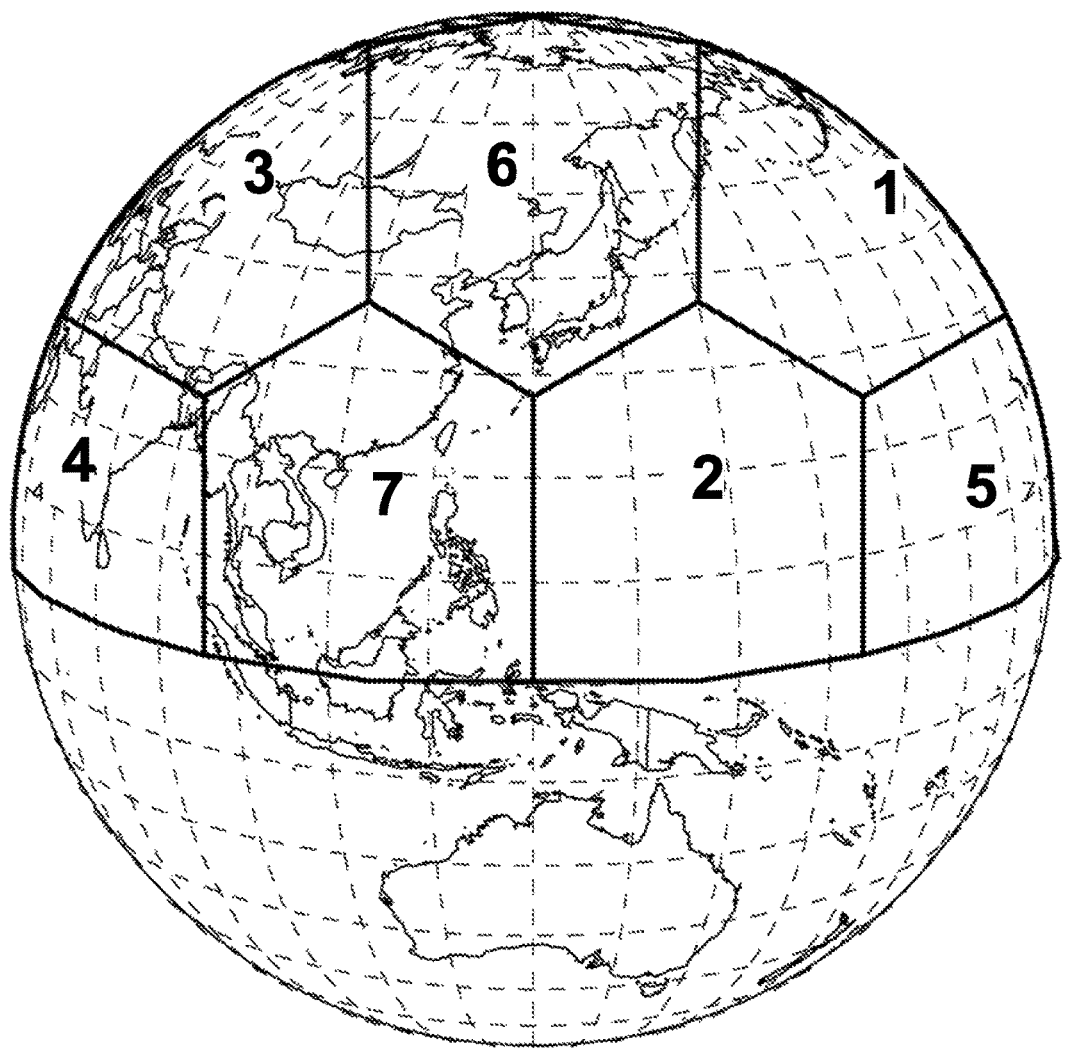
FIG. 5 illustrates another example of a coverage map indicating the location, frequency, and polarization of multiple beams.

FIG. 5 illustrates a map of another example implementation indicating the coverage region of each beam indicating the location, frequency, and polarization of each of the seven beams. Four of the beams, (beams 1, 3, 5, and 7, each in the illustrated example having a right-hand circular polarization) are associated with a first 4×4 MPA 350(1) and the other three beams (beams 2, 4, and 6, each in the illustrated example having a left-hand circular polarization) are associated with a second 4×4 MPA 350(2). As indicated above, a respective filter 360(1)-360(7) may be disposed at the output of each MPA port and may provide about 15 dB rejection at the adjacent channel edge. The implementations illustrated in both FIG. 3 and FIG. 4 provide that adjacent coverage regions are diverse (different) in channel center frequencies, and/or are diverse (different) in antenna polarization.

Figure 6:
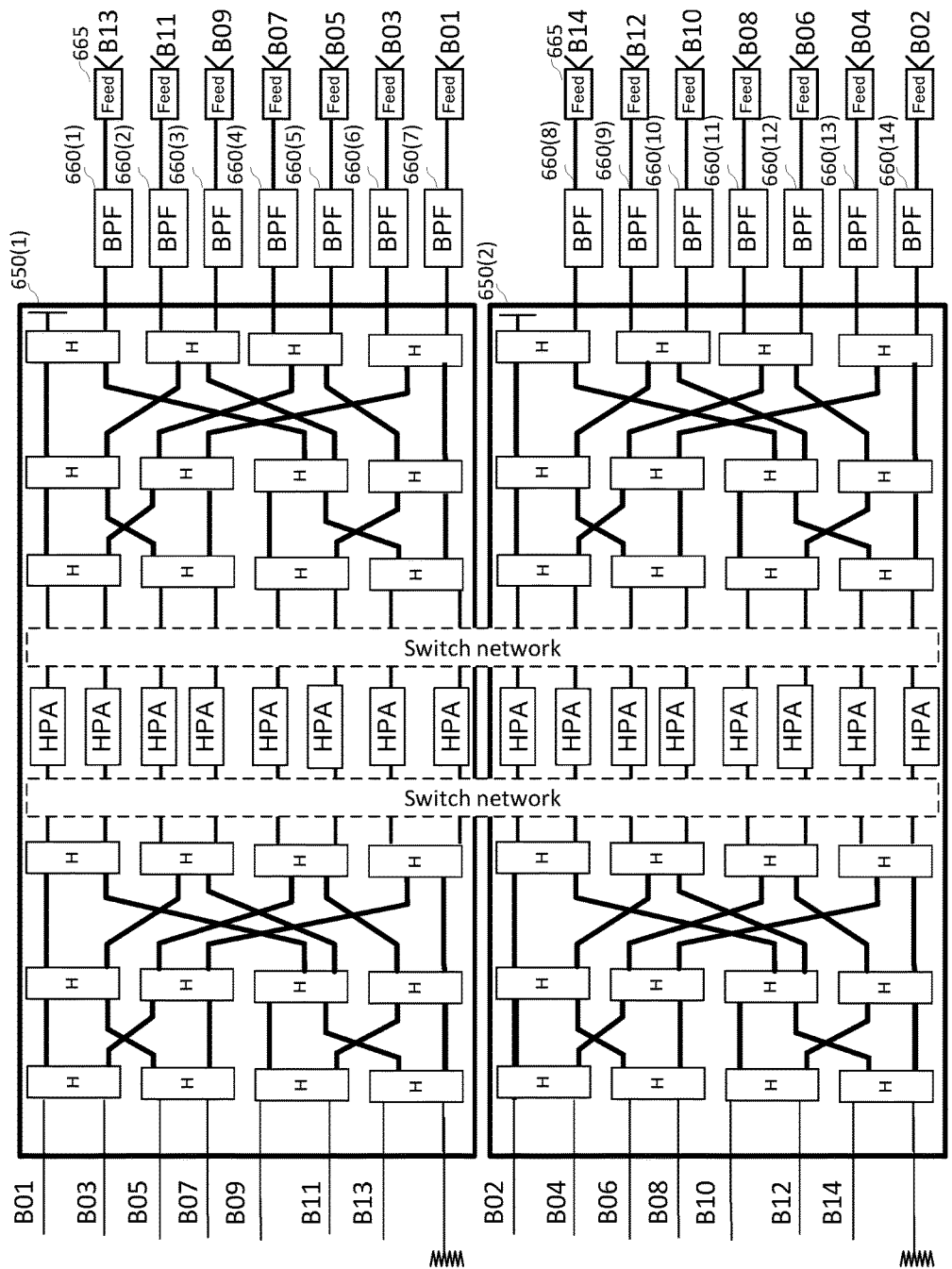
FIG. 6 illustrates an example implementation that includes two 8×8 MPAs serving 14 beams.
Figure 7:
FIG. 7 illustrates an example of a coverage map indicating the location, frequency, and polarization of multiple beams.
Figure 8:
FIG. 8 illustrates another example of a coverage map indicating the location, frequency, and polarization of multiple beams.

Referring to FIG. 6, an example implementation that includes two 8×8 MPAs 650(1) and 650(2) serving 14 beams is illustrated. While not shown in the figure, an example implementation can include spare HPAs. FIG. 7 illustrates an example of a coverage map indicating the location, frequency, and polarization of the fourteen beams. Seven of the beams, (beams 1, 3, 5, 7, 9, 11, and 13, each in the illustrated example having an H polarization) are associated with a first 8×8 MPA 650(1) and the other seven beams (beams 2, 4, 6, 8, 10, 12, and 14, each in the illustrated example having a V polarization) are associated with a second 8×8 MPA 650(2). In the illustrated implementation, a respective frequency filter 660(i) is disposed at the output of each MPA port and may provide about 15 dB rejection at the adjacent channel edge. FIG. 8 illustrates another example of a coverage map indicating the location, frequency, and polarization of the fourteen beams. Seven of the beams, (beams 1, 3, 5, 7, 9, 11, and 13, each in the illustrated example having a right-hand circular polarization) are associated with a first 8×8 MPA 650(1) and the other seven beams (beams 2, 4, 6, 8, 10, 12, and 14, each in the illustrated example having a left-hand circular polarization) are associated with a second 8×8 MPA 650(2). As indicated above, a respective frequency filter 660(i) may be disposed at the output of each MPA port and may provide about 15 dB rejection at the adjacent channel edge. The implementations illustrated in both FIG. 7 and FIG. 8 provide that adjacent coverage regions are diverse in channel center frequencies, and/or are diverse in antenna polarization.

Figure 9:
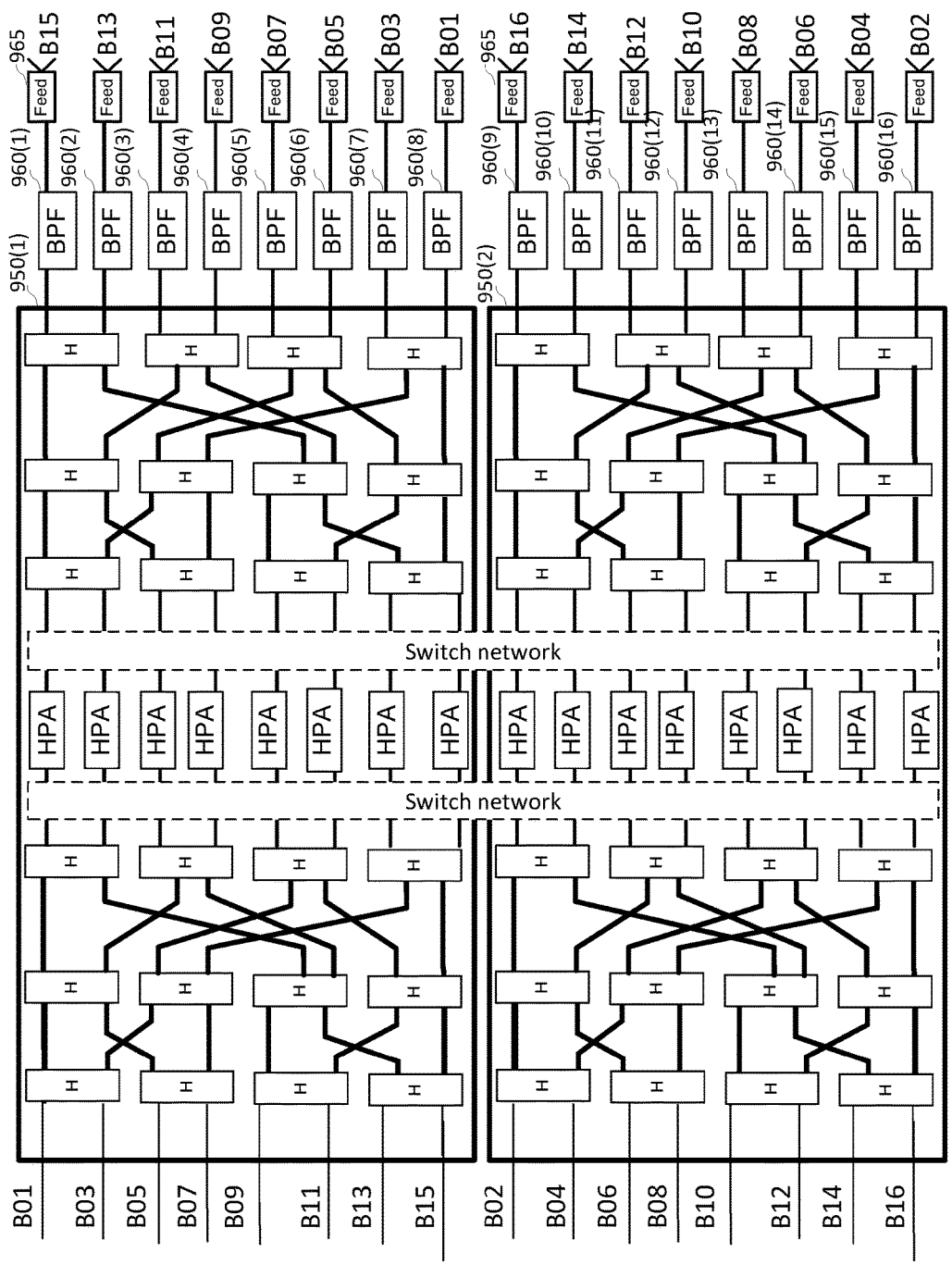
FIG. 9 illustrates an example implementation that includes two 8×8 MPAs serving 16 beams.
Figure 10:
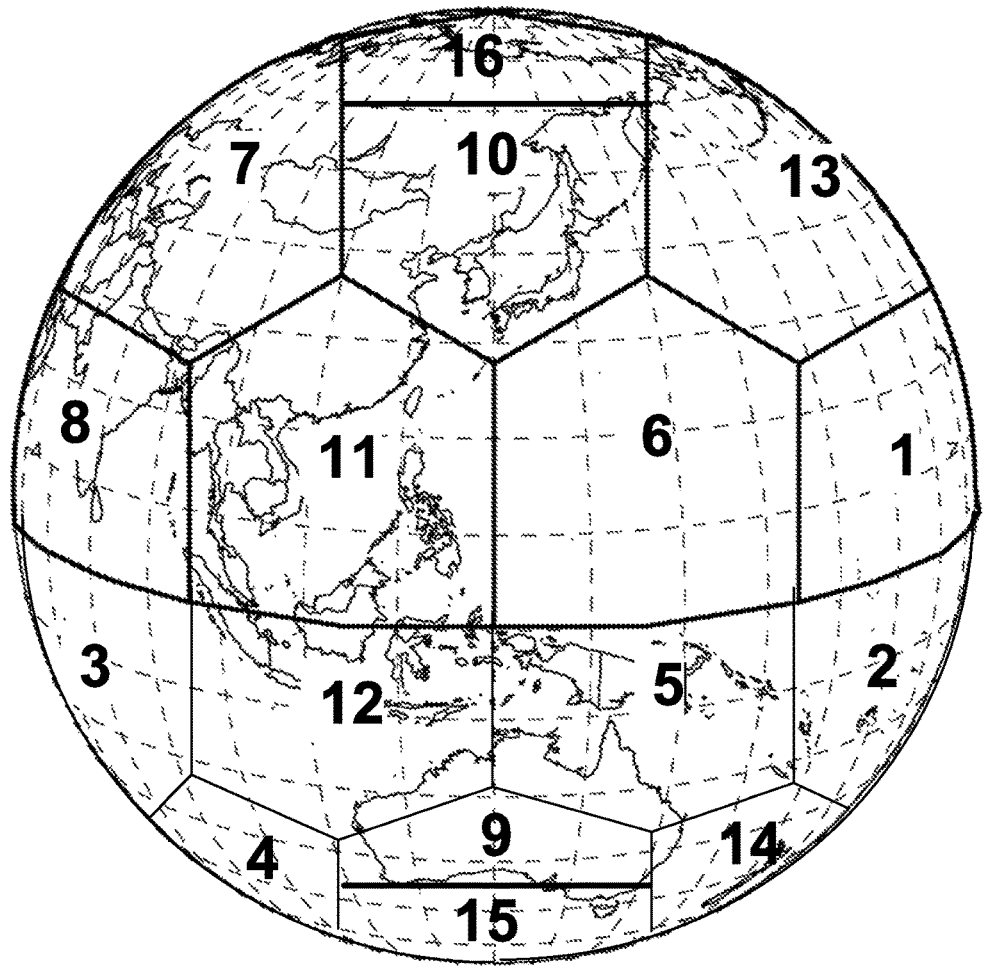
FIG. 10 illustrates an example of a coverage map indicating the location, frequency, and polarization of multiple beams.

Referring to FIG. 9, an example implementation that includes two 8×8 MPAs 950(1) and 950(2) serving 16 beams is illustrated. While not shown in the figure, an example implementation can include spare HPAs. FIG. 10 illustrates an example of a coverage map indicating the location, frequency, and polarization of the 16 beams. Eight of the beams, (beams 1, 3, 5, 7, 9, 11, 13 and 15, each in the illustrated example having an H polarization) are associated with a first 8×8 MPA 950(1) and the other eight beams (beams 2, 4, 6, 8, 10, 12, 14 and 16, each in the illustrated example having a V polarization) are associated with a second 8×8 MPA 950(2). In the illustrated implementation, a respective frequency filter 960(i) is disposed at the output of each MPA port and provides about 15 dB rejection at the adjacent channel edge. Compared to the multiport amplifier configuration shown in FIG. 6, where at least one of the input/output paths is terminated, FIG. 9 illustrates an implementation where all N ports of the N by N multiport amplifier, are coupled to transmit antenna feeds through the respective frequency filters.

In some implementations, the frequency filters are configured to operate at a frequency band of Ku band or higher.

In some implementations, the frequency filter has a rolloff characteristic such that there is 15 dB attenuation at the channel edge.

In some implementations, the frequency filter is implemented as a surface acoustic wave filter.

In some implementations, the frequency filter may be or include a band pass filter with a 15 dB attenuation at the channel edge. The frequency filter can also be implemented as a combination of a low-pass and high-pass filter. The frequency filter for a particular antenna beam can also be implemented as a low-pass filter if all adjacent co-polarization antenna beams have a higher assigned channel center frequency relative to the channel center frequency associated with the particular antenna beam (e.g., channels 1 and 5 of FIG. 4 are co-polarization adjacent beams, and channel 5 is a higher channel center frequency than channel 1, thus the frequency filter for beam 1 can be a low-pass filter). The frequency filter for a particular antenna beam can also be implemented as a high-pass filter if all adjacent co-polarization antenna beams have a lower assigned channel center frequency relative to the channel center frequency associated with the particular antenna beam (e.g., channels 1 and 5 of FIG. 4 are co-polarization adjacent beams, and channel 5 is a higher channel center frequency than channel 1, thus the frequency filter for beam 5 can be a high-pass filter).

In some implementations, co-polarization antenna feeds can be the same circular polarization. In other implementations, co-polarization antenna feeds can be the same linear polarization.

In some implementations, the passband of a particular frequency filter is at least as wide as a channel bandwidth assigned to the transmit antenna feed associated with the particular frequency filter. For example, if adjacent co-polarization transmit antenna feeds are separated by more than one channel bandwidth, the respective frequency filters of the adjacent co-polarization transmit antenna feeds can be greater than one channel bandwidth (e.g., spatially adjacent channels 5 and 11 of FIG. 7 are separated in frequency by channels 7 and 9, therefore the frequency filters for channels 5 and 11 can have a passband twice the bandwidth of a channel bandwidth).

In some implementations, an area-beam satellite system, may include a payload subsystem including a plurality of fixed and/or steerable receive and transmit antennas, a plurality of LNAs, a plurality of frequency converters, a digital channelizer whose inputs are communicatively coupled with a respective receive antenna, a plurality of power amplifiers, each power amplifier having a respective input communicatively coupled with a respective output of the digital channelizer and each power amplifier having a respective output communicatively coupled with at least one of the plurality of transmit antenna. The satellite system may also include a processor or processors configured to simultaneously control the digital channelizer and one or more power amplifiers so as to allocate a commandable amount of satellite uplink bandwidth to each of a plurality of receive beams, allocate a commandable amount of satellite downlink bandwidth to each of a plurality of transmit beams, and to adjust the saturated output power of at least one power amplifier associated with at least one of the plurality of transmit beams.

In some implementations, a multiple spot-beam satellite system may include a payload subsystem including a plurality of fixed and/or steerable receive and transmit spot beam antennas with a single feed per spot beam, a plurality of LNAs whose inputs are communicatively coupled to one or more receive spot beams, a plurality of frequency converters, digital channelizer(s) whose inputs are communicatively coupled with a respective receive spot beam, a plurality of power amplifiers, each power amplifier having a respective input communicatively coupled with a respective output of the digital channelizer and each power amplifier having a respective output communicatively coupled with at least one of the plurality of transmit spot beams. The satellite system may also include a processor or processors configured to simultaneously control the digital channelizer(s) and one or more power amplifiers so as to allocate a commandable amount of satellite uplink bandwidth to each of a plurality of receive spot beams, allocate a commandable amount of satellite downlink bandwidth to each of a plurality of transmit spot beams, and to adjust the saturated output power of at least one high power amplifier associated with at least one of the plurality of transmit beams.

In some implementations, a variable power high power amplifier may be configured as an MPA which includes identical or nearly identical fixed power amplifiers whose inputs are communicatively coupled to a plurality of digital channelizer output ports. In some implementations an input Butler Matrix network function is implemented in a plurality of digital channelizer output ports.

In some implementations, the variable power high power amplifier may be configured as an MPA which includes a number of identical or nearly identical variable power high power amplifiers whose inputs are communicatively coupled to a plurality of digital channelizer output ports and whose output power levels are set and varied approximately in unison. In some implementations an input Butler Matrix network function is implemented in a plurality of digital channelizer output ports.

In some implementations, a multiple spot-beam satellite system may include a payload subsystem including a plurality of fixed and/or steerable receive and transmit spot beam antennas with multiple feeds per spot beam, a plurality of LNAs whose inputs are communicatively coupled to one or more receive spot beam feed elements, a plurality of frequency converters, digital channelizer(s) whose inputs are communicatively coupled with a respective receive spot beam feed element, a plurality of power amplifiers, each power amplifier having a respective input communicatively coupled with a respective output of the digital channelizer and each power amplifier having a respective output communicatively coupled with at least one of the plurality of transmit spot feed elements. The satellite system may also include a processor or processors configured to simultaneously control the digital channelizer(s) and one or more power amplifiers so as to allocate a commandable amount of satellite uplink bandwidth to each of a plurality of receive spot beams, provide beam forming function to a plurality of receive spot beams, allocate a commandable amount of satellite downlink bandwidth to each of a plurality of transmit spot beams, provide beam forming function to a plurality of transmit spot beams, and to adjust the saturated output power of at least one power amplifier associated with at least one of the plurality of transmit spot beam feed elements.

In some implementations, the satellite system may include an area beam and/or single feed element per receive and/or transmit spot beam.

In some implementations, the power amplification arrangement provides a carrier-to-isolation (C/I) between adjacent feeds of at least 30 dB in the absence of calibration of gain and phase variations over life and compensation for the variations.

In some implementations, the power amplification arrangement provides a carrier-to-isolation (C/I) between adjacent feeds of at least 30 dB and calibration of gain and phase variations over life and compensation for the variations is avoided.

Thus, an MPA using output filtering to improve performance over life has been described. The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. A payload subsystem of a satellite, comprising:
a plurality of transmit antenna feeds, a plurality of frequency filters, and a power amplification arrangement including a plurality of power amplifiers, the power amplification arrangement having at least one multiport amplifier, the multiport amplifier including a plurality of output ports, wherein:
each output port is coupled with a respective one of the plurality of transmit antenna feeds; and
each antenna feed is coupled with a single respective output port by way of a respective one of the plurality of frequency filters.

2. The payload subsystem of claim 1, wherein the payload subsystem is configured to operate at a frequency band of Ku band or higher.

3. The payload subsystem of claim 1, wherein the power amplification arrangement is configured to exhibit a ratio of carrier-to-isolation (C/I), between adjacent ones of the plurality of transmit antenna feeds, of at least 30 dB.

4. The payload subsystem of claim 3, wherein the power amplification arrangement exhibits a C/I, between adjacent ones of the plurality of transmit antenna feeds, of at least 30 dB irrespective of whether calibration of gain and phase variations over life and compensation for the gain and phase variations is performed.

5. The payload subsystem of claim 4, wherein calibration of the gain and phase variations over life and compensation for the gain and phase variations is avoided.

6. The payload subsystem of claim 3, wherein the transmit antenna feeds correspond to a coverage map comprising a plurality of coverage regions, wherein adjacent coverage regions are diverse in one or both of channel center frequency and antenna polarization.

7. The payload subsystem of claim 6, wherein the antenna polarization is diverse in one or both of linear polarization type and circular polarization type.

8. The payload subsystem of claim 1, wherein:
the payload subsystem further includes a digital channelizer configured to process a plurality of input signals and to create reconfigurable channels to route the plurality of input signals to a plurality of digital channelizer output ports; and
the plurality of digital channelizer output ports are communicatively coupled to the at least one multiport amplifier.

9. The payload subsystem of claim 8, wherein the at least one multiport amplifier includes a plurality of identical or nearly identical fixed power high power amplifiers (HPAs) whose inputs are communicatively coupled to the plurality of digital channelizer output ports.

10. The payload subsystem of claim 8, wherein the at least one multiport amplifier includes a plurality of identical or nearly identical variable power high power amplifiers (HPAs) whose inputs are communicatively coupled to the plurality of digital channelizer output ports, wherein output power levels of the variable power HPAs are set and varied approximately in unison.

11. The payload subsystem of claim 1, wherein at least one of the frequency filters has a rolloff characteristic such that there is 15 dB attenuation between adjacent ones of the plurality of transmit antenna feeds.

12. The payload subsystem of claim 1, wherein the frequency filters include surface acoustic wave filters.

13. The payload subsystem of claim 1, wherein the frequency filters are implemented as a band pass filter, a low-pass filter, a high-pass filter, or a serial combination of low-pass and high-pass filters.

14. The payload subsystem of claim 1, wherein the frequency filters have a passband at least as wide as a channel bandwidth allocated for one of the transmit antenna feeds.

15. The payload subsystem of claim 1, wherein the power amplifiers are implemented as either SSPAs or TWTAs.

16. A satellite, comprising:
a payload subsystem including a plurality of transmit antenna feeds, a plurality of frequency filters, and a power amplification arrangement including a plurality of power amplifiers, the power amplification arrangement having at least one multiport amplifier, the multiport amplifier including a plurality of output ports, wherein:
each output port coupled with a respective one of the plurality of transmit antenna feeds;
each antenna feed is coupled with a single respective output port by way of a respective one of the plurality of frequency filters; and
the payload subsystem is configured to operate at a frequency band of Ku band or higher.

17. The satellite of claim 16, wherein the power amplification arrangement is configured to exhibit a ratio of carrier-to-isolation (C/I), between adjacent ones of the plurality of transmit antenna feeds, of at least 30 dB.

18. The satellite of claim 17, wherein the power amplification arrangement exhibits a C/I, between adjacent ones of the plurality of transmit antenna feeds, of at least 30 dB irrespective of whether calibration of gain and phase variations over life and compensation for the gain and phase variations is performed.

19. The satellite of claim 18, wherein calibration of gain and phase variations over life and compensation for the gain and phase variations is avoided.

20. The satellite of claim 17, wherein the transmit antenna feeds correspond to a coverage map comprising a plurality of coverage regions, wherein adjacent coverage regions are diverse in one or both of channel center frequency and antenna polarization.

* * * * *